(12) United States Patent
Mittleman et al.

(10) Patent No.: US 8,963,036 B2
(45) Date of Patent: Feb. 24, 2015

(54) CAPACITIVE DOME SWITCH

(71) Applicant: Apple Inc., Cupertino, CA (US)

(72) Inventors: Adam Mittleman, Portola Valley, CA (US); Nicholas G. Merz, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/902,953

(22) Filed: May 27, 2013

(65) Prior Publication Data

US 2013/0299331 A1 Nov. 14, 2013

Related U.S. Application Data (63) Continuation of application No. 12/893,409, filed on Sep. 29, 2010, now Pat. No. 8,450,627.

(51) Int. Cl.
*H03K 17/975* (2006.01)
*H03K 17/96* (2006.01)

(52) U.S. Cl.
CPC ............ *H03K 17/975* (2013.01); *H03K 17/962* (2013.01); *H01H 2215/006* (2013.01); *H01H 2239/006* (2013.01); *H03K 2217/96062* (2013.01); *H03K 2217/960755* (2013.01)
USPC ...................................... 200/600

(58) Field of Classification Search
USPC ......... 200/600, 5 A, 5 R, 19.06, 46, 402, 406, 200/412, 468, 511–513, 520, 329, 341; 341/22, 33, 34; 345/168, 169
See application file for complete search history.

(56) References Cited

U.S. PATENT DOCUMENTS

| | | | |
|---|---|---|---|
| 3,643,041 A | 2/1972 | Jackson | |
| 3,710,209 A | 1/1973 | Webb et al. | |
| 4,083,100 A | 4/1978 | Flint et al. | |
| 4,584,444 A | 4/1986 | Nagashima | |
| 5,193,669 A | 3/1993 | Demeo et al. | |
| 5,270,710 A | 12/1993 | Gaultier et al. | |
| 6,323,449 B1 | 11/2001 | Janniere | |
| 6,723,933 B2 | 4/2004 | Haag et al. | |
| 7,115,825 B2 | 10/2006 | Aisenbrey | |
| 7,129,854 B2 * | 10/2006 | Arneson et al. | 341/34 |
| 7,145,092 B2 | 12/2006 | Tuhkala | |
| 7,166,813 B2 * | 1/2007 | Soma et al. | 200/600 |
| 7,312,790 B2 * | 12/2007 | Sato et al. | 345/173 |
| 7,355,137 B2 | 4/2008 | Kawasaki et al. | |
| 7,579,569 B2 | 8/2009 | Romanowski | |
| 7,652,230 B2 | 1/2010 | Baier | |
| 7,786,400 B2 | 8/2010 | Baier | |
| 7,834,287 B2 | 11/2010 | Heiman et al. | |

(Continued)

*Primary Examiner* — Edwin A. Leon
*Assistant Examiner* — Anthony R. Jimenez
(74) *Attorney, Agent, or Firm* — Brownstein Hyatt Farber Schreck, LLP (57) ABSTRACT

This is directed to a dome switch that includes a capacitive sensor. A dome switch can include a dome operative to deform to provide tactile feedback to a user. To provide an electrical instruction to the device, the region underneath the dome can define a free space separating conductive regions forming a capacitor. For example, a tip of the dome, a button placed between the dome and a circuit board, or a user's finger can form a first conductor of a capacitor, and a support structure for the dome can include a terminal forming a second conductor completing the capacitor. When the dome deflects, the distance between the conductors can change and provide a measurable capacitance variation, which the device can detect.

23 Claims, 4 Drawing Sheets

(56) References Cited

U.S. PATENT DOCUMENTS

| | | |
|---|---|---|
| 8,111,522 B2 | 2/2012 | Rothkopf et al. |
| 8,314,354 B2 | 11/2012 | Prest et al. |
| 8,450,627 B2 * | 5/2013 | Mittleman et al. ............ 200/600 |
| 2002/0180707 A1 * | 12/2002 | Sato et al. .................... 345/169 |

* cited by examiner

CAPACITIVE DOME SWITCH

CROSS-REFERENCE TO RELATED APPLICATION

This application is a continuation patent application of U.S. patent application Ser. No. 12/893,409, filed Sep. 29, 2010 and titled "Capacitive Dome Switch," which claims the benefit of U.S. Provisional Patent Application No. 61/320,718, filed Apr. 1, 2010, and titled "Capacitive Dome Switch," the disclosures of which are hereby incorporated herein by reference in their entireties.

BACKGROUND OF THE INVENTION

Users can provide inputs to electronic devices using many different approaches. In particular, an electronic device can include one or more types of input interfaces including, for example, a button, switch, slider, touch interface, wheel, or combinations of these. In some cases, an input interface can include one or more dome switches. Using a traditional dome switch, a user can at least partially invert a dome to close an electrical circuit underneath the dome and provide a detectable input. The dome switch is typically constructed by placing a conductive dome over a contact pad on a circuit board. When the dome is pressed, the dome can invert such that the inner surface of the dome contacts the contact pad, and provides a conductive path between the periphery of the dome and the contact pad. The dome inversion can also provide a tactile 'click' that enhances the user's interaction with the switch. A user can actuate a dome switch using any suitable approach including, for example, by applying a force directly to the dome, or by pressing a cosmetic component having a nub that is aligned with the dome.

A dome switch can include one or more openings for allowing air to be displaced from underneath the dome when the dome is depressed (e.g., to decrease the air pressure under the dome and provide a desired tactile feedback). For example, a dome switch can include one 02 more openings in a layer provided over the dome for securing the dome to the circuit board. The openings in the dome switch, however, can provide a path for debris, water, or other external particles or contaminants to enter a volume underneath the dome and around the contact pad. If contaminants infiltrate the volume, the contaminants can cause corrosion or promote the formation of substances that prevent the proper operation of the switch. For example, foreign particles can cause rust, oxidation, dendrite growth, or salt, sugar or chemical deposits. As another example, water can infiltrate the internal volume of the dome switch and short the switch.

SUMMARY OF THE INVENTION

A dome switch that does not rely on direct electrical contact is provided. In particular, a dome switch having a capacitive sensor for detecting when a user's finger actuates the dome can be provided.

A dome switch can be formed from a dome placed over a circuit board. To provide a signal to an electronic device, the dome can be pressed and inverted. When the dome is inverted, the distance between a summit or a top of the dome and the circuit board can decrease such that opposing conductors positioned on the dome summit and on the circuit board can approach each other. Detection circuitry or a controller coupled to the dome switch can measure a change in capacitance between the conductors due to the change in distance between the conductors, and can interpret the change in capacitance as a user press of the dome switch.

In some embodiments, the controller can define several capacitance thresholds representing different button presses. For example, a first threshold can represent a user placing a finger on the button, while a second threshold can represent the user pressing the button and deflecting the dome. As another example, the amount by which a user depresses the dome can correspond to different thresholds, which can correspond to different inputs. In some embodiments, a dome can be constructed to have a variable resistance to deformation, such that a user can detect tactily several intermediate deformation amounts as the user depresses the dome.

By using a capacitive sensor to detect an input provided by a user as part of a dome switch, the components used to provide and detect an input can be isolated and protected from damage caused by contaminants. In particular, because the different controllers and conductors may not need to come into direct contact, there may be no conductive interface between the conductors that can be damaged by contaminants (e.g., water). In fact, the presence of contaminants underneath a dome (e.g., between a conductor of the dome and a conductor of the circuit board) can have little or no effect on the capacitance detected by a controller. This can enhance the reliability of the dome switch. Furthermore, the tactile feedback provided by a dome may be easily tuned without affecting the electrical performance of the switch by decoupling the tactile feedback from the electrical detection of an input.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

Figure 1:
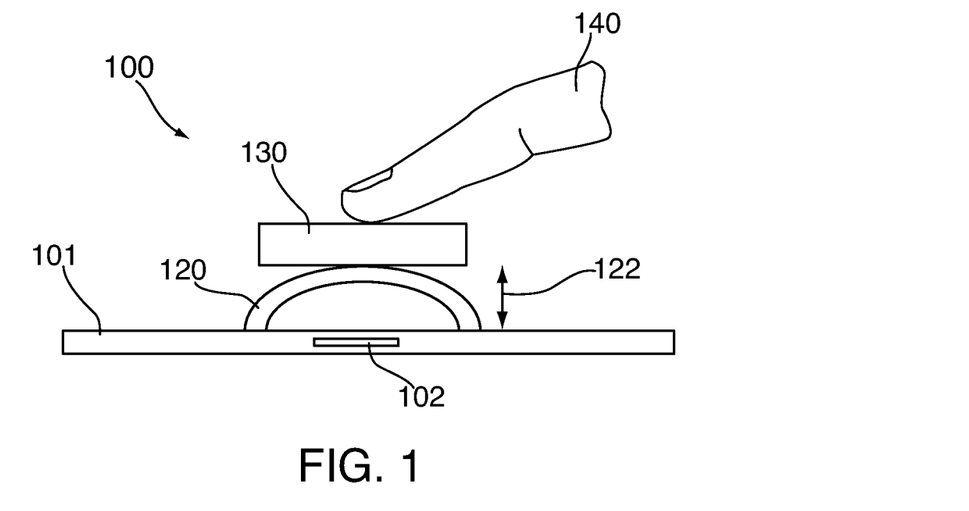
FIG. 1 is a cross-sectional view of an illustrative dome switch including a capacitive sensing mechanism in accordance with one embodiment of the invention.

An electronic device can include several input interfaces for detecting inputs provided by a user. In particular, an electronic device can include one or more dome switches that the user can actuate. FIG. 1 is a cross-sectional exploded view of an illustrative dome switch including a capacitive sensing mechanism in accordance with one embodiment of the invention. Switch 100 can include circuit board 101 over which dome 120 is placed. Circuit board 101 can include terminal 102 positioned on or in a region of the circuit board that in within a periphery of dome 120. For example, terminal 102 can be positioned on a surface of circuit board 101, or within a stack of layers combining to form circuit board 101. The terminal can have any position relative to dome 120. For example, terminal 102 can be located substantially near a center point or center of mass of a periphery of the dome. As another example, the terminal can be substantially aligned with an apex of the dome, or with a region of the dome that deforms most easily towards the circuit board.

Terminal 102 can be electrically connected to any suitable electronic device component to provide a signal indicating that a user has provided an input to dome switch 100 (e.g., that the user has caused dome 120 to deflect). In some embodiments, terminal 102 can be electrically connected to a controller operative to detect a change in electrical attributes associated with terminal 102 when dome 120 is depressed. The controller can detect any suitable electrical attribute of the terminal including, for example, changes in value or measured values of voltage, current, resistance, power, capacitance, impedance, or combinations of these. The particular electrical attribute detected can include direct contact of components with terminal 102 (e.g., direct contact to change resistance), or indirect interactions with the terminal (e.g., changing the distance between conductors to change capacitance).

In some embodiments, button 130 can be placed over dome 120, such that the dome can be depressed and at least partially inverted by pressing the button using finger 140. Button 130 can be constructed from any suitable material including, for example, a metal (e.g., aluminum or stainless steel), plastic, composite material, or combination of these. In some embodiments, button 130 can include one or more particular finishes corresponding to industrial design requirements or desires for the electronic device. Button 130 can include any suitable feature for interfacing with dome 120. In some embodiments, button 130 can include a nub, recess, or other feature to control the interface between the button and the dome. In particular, one or both of button 130 and dome 120 can include corresponding features to ensure the alignment and engagement of the button and dome. The button can be maintained at any suitable distance 122 from terminal 102 when no force is applied to deflect dome 120. In some embodiments, the particular distance can be controlled from the one or more features used at the interface between dome 120 and button 130.

When a user applies a force to the dome, for example via the button, the dome can provide a tactile resistance that the user must overcome to at least partially invert the dome. The dome shape, size, thickness, and position can be tailored or tuned to adjust the amount or intensity of feedback provided. For example, a dome can be constructed from a less elastic material to increase the required force, or the dome diameter can decrease to increase the required force. To ensure that a user's experience interacting with the dome switch is satisfactory, it may be important to correlate the deflection of the dome switch with an electronic device operation. In particular, the electronic device should detect an input and perform a corresponding operation when the dome deflection is felt by the user.

In some embodiments, providing a dome switch that operates without requiring an electrical contact between the dome and a circuit board can provide advantages in tuning the switch to perfect a user's experience. For example, the size, travel, and material used for a dome can be changed or modified to tune the tactile feel of actuating the dome switch without modifying or affecting the ability of a controller to detect that the switch was actuated. In particular, if a capacitor is defined between a terminal in a circuit board and either a button placed over a dome, or a finger placed on a button or dome, the size or travel of the dome, or the dome material may not be relevant to detecting switch actuation. This approach can therefore facilitate product development and industrial design, as the electrical functionality of the dome switch can be separated from its appearance and tactile feel.

Figure 2:
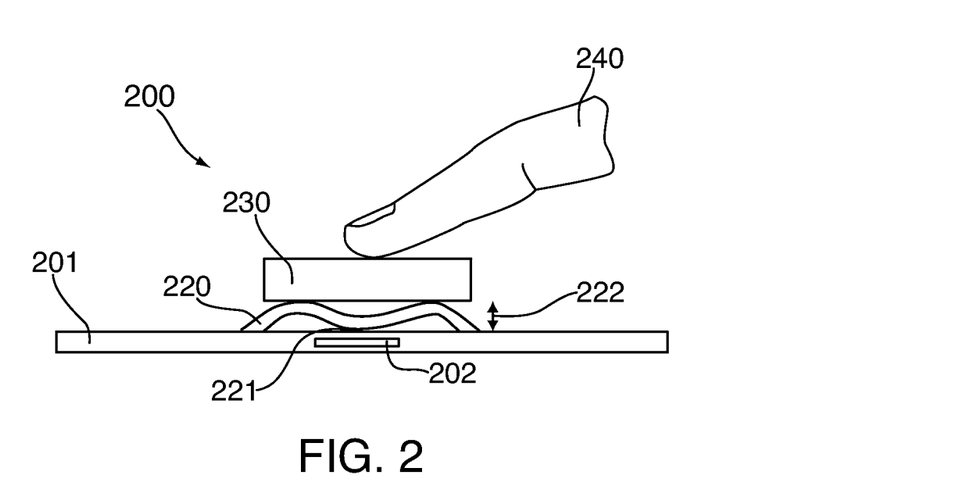
FIG. 2 is a cross-sectional view of the dome switch of FIG. 1 when it has been depressed in accordance with one embodiment of the invention.

FIG. 2 is a cross-sectional view of the dome switch of FIG. 1 when it has been depressed in accordance with one embodiment of the invention. Dome switch 200 can include some or all of the features of dome switch 100 (FIG. 1) including, for example, circuit board 201, terminal 202, dome 220 and button 230 having some or all of the features of the corresponding components of dome switch 100. When finger 240 presses button 230, the button can travel towards terminal 202 such that the resulting distance between the button and the terminal is distance 222, which can be less than distance 122 (FIG. 1). Finger 240 may be required to apply and hold a particular force on button 230 to cause dome 220 to invert at least partially, as shown in FIG. 2. When inverted, tip 221 of dome 220 can approach terminal 202, and in some cases even touch the contact pad (e.g., to provide an electrical path in non-capacitive based approaches).

Figure 3A:
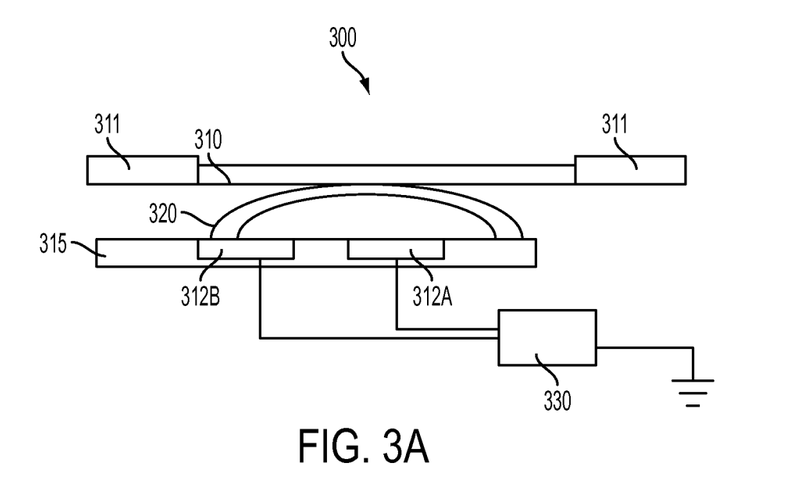
FIG. 3A is a cross-sectional view of illustrative capacitive sensing assembly in accordance with one embodiment of the invention.
Figure 3B:
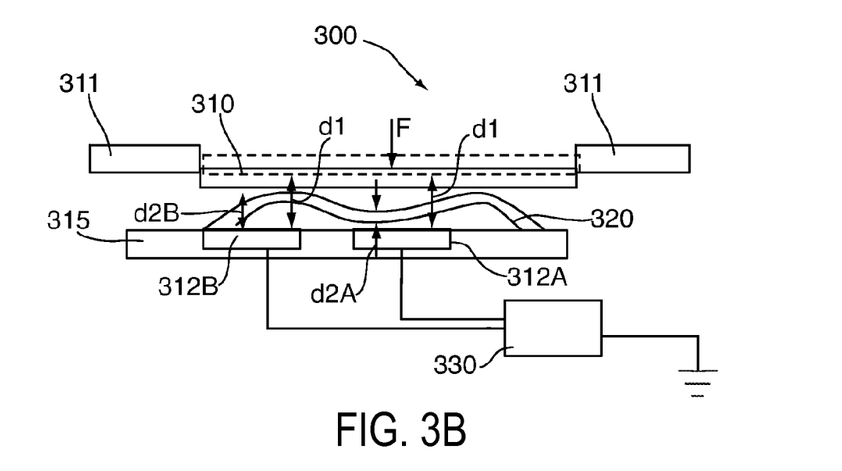
FIG. 3B is a cross-sectional view of illustrative capacitive sensing assembly when a button is pressed to deflect a dome in accordance with one embodiment of the invention.

In some embodiments, capacitive sensing circuitry or a controller can be coupled with or incorporated in switch 100 or 200 to detect an input when a user applies a force to the dome. For example, a controller can detect a change in capacitance or inductance measured at terminal 202 when a second conductor or terminal approaches terminal 202 as the dome is depressed. The controller can be integrated with or connected to the switch using any suitable approach. FIG. 3A is a cross-sectional view of an illustrative capacitive sensing assembly in accordance with one embodiment of the invention. FIG. 3B is a cross-sectional view of an illustrative capacitive sensing assembly when a button is pressed to deflect a dome in accordance with one embodiment of the invention. Assembly 300 can include housing 311 forming part of an electronic device. For example, housing 311 may be part of one or more surfaces of an electronic device enclosure. In particular, housing 311 can define one or more internal or external walls of an electronic device. Housing 311 can be constructed from any suitable material. In some embodiments, housing 311 can be constructed at least in part using metallic or electrically conductive materials such as anodized aluminum, steel, titanium or other metals. In some embodiments, housing 311 can instead or in addition be constructed from the combination of metallic and nonmetallic materials (e.g., metal and plastic), or combinations of different metallic or conductive materials. In some cases, particular elements of housing 311 can include both metallic and non-metallic components. For example, one or more components can include plastic over-molded on metallic components.

In some embodiments, housing 311 can include button 310 operative to be move within housing 311 in response to the application of a force by a user. For example, housing 311 can include an opening in which a button is received, where the housing includes features (e.g., the shape of the opening) that control the displacement of the button within the housing. In some embodiments, button 310 can be constructed from a conductive material, or include a conductive element, while housing 311 can be constructed from a dielectric or electrically insulating material.

Figure 3C:
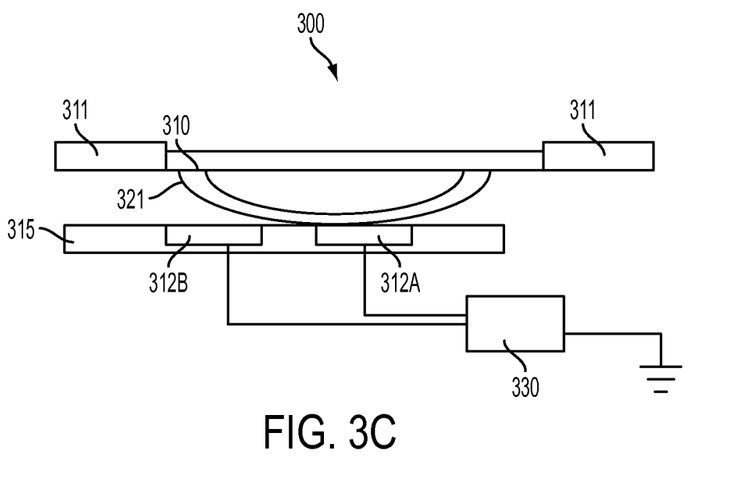
FIG. 3C is a cross-sectional view of illustrative capacitive sensing assembly in accordance with an alternative embodiment of the invention.

Assembly 300 can include dome 320 positioned between button 310 and a support structure (e.g., circuit board 315), such that the dome can maintain the button away from the support structure by a predetermined distance. The distance can be selected such that the output of a controller or sensing mechanism corresponds to an output indicating that no input is provided by a user using the assembly. Dome 320 can be disposed between button 310 and circuit board 315 using any suitable approach. In some embodiments, dome 320 can be disposed such that a periphery of the dome is in contact with a surface of circuit board 315, and a tip of the dome is in contact with a surface of button 310. Alternatively, dome 320 can be reversed, such that the periphery of the dome is in contact with a surface of button 310, and a tip of the dome is in contact with circuit board 315 (e.g., inverted dome 321 shown in FIG. 3C). The particular disposition of the dome within assembly 300 may not matter electrically, as the purpose of the dome may be limited to providing tactile feedback. This is in contrast with traditional dome switches, in which the partial inversion of a dome creates an electrical contact that can be detected by a circuit.

Because the tactile feedback provided by the dome can be disassociated from an electrical signal detected by the assembly, dome 320 can have any suitable shape that provides a tactile feedback to a user. For example, dome 320 can include several ridges and valleys (e.g., concentric domes) that can deform in sequence or in parallel. As another example, dome 320 can include a spring operative to deflect when a force is applied, and return to its initial position when the force is removed. Such springs can include, for example, a helical spring, cantilever spring, leaf spring, Belleville washer, torsion spring, gas spring, or a combination of these. In some embodiments, the materials selected for dome 320 or its equivalent can be selected based on desired tactile feedback properties.

Assembly 300 can use any suitable approach to detect a force applied to button 310. In some embodiments, assembly 300 can include controller 330 operative to detect an electrical attribute corresponding to assembly 300 in response to a user applying a force to button 310. Controller 330 can detect any suitable electrical attribute or a change in any suitable electrical attribute. For the simplicity of the following discussion, however, assembly 300 will be described in the context of detecting changes in capacitance resulting from the user pressing button 310 (or applying a force directly to dome 320, if no button is used). Controller 330 can be coupled to any suitable sensor or terminal from which a change in capacitance can be detected. In response to detecting a suitable electrical attribute or a change in a suitable electrical attribute, control circuitry of an electronic device that includes the dome switch can direct the electronic device to perform a particular operation.

In some embodiments, assembly 300 can include terminals 312A and 312B coupled to or integrated within circuit 315. In some embodiments, terminals 312A and 312B can be integrated in other components of the electronic device including, for example, housing elements, structural components of the device, or other elements of the electronic device that are not necessarily part of the dome switch. Assembly 300 can include any suitable number of terminals including, for example just one terminal, or several terminals. The terminals can be placed at any suitable position or distance relative to button 310 (e.g., distance d1 shown in FIG. 3A). In particular, terminals can be positioned such that the capacitance corresponding to each terminal relative to the button or relative to another terminal is known when the button is not depressed. In addition, the terminals can be positioned to detect the particular location of a user's finger on button 310 (e.g., whether the user's finger is closer to a center or side of the button) based on capacitance values detected at different terminals of the assembly. In some embodiments, one or more terminals can be located away from dome 320 (e.g., partially or entirely not within an area enclosed by a periphery of the dome).

Terminals 312A and 312B can be constructed from any suitable material. In some embodiments, one or both of the terminals can be constructed from a conductive material operative to store a charge that can be detected by an appropriate sensor. For example, the terminals can be constructed from a metal to constitute a conductor of a capacitor. In one implementation, each of terminals 312A and 312B can serve as opposing conductors of a capacitor, where portions of circuit 315 can serve as a dielectric between the conductors of the capacitor. In another implementation, button 310 or housing 311 (or portions of the button or housing that include a conductive component), or a user's finger placed over the button or housing can serve as one conductor of a capacitor, and each of terminals 312A and 312B can serve as a second conductor of different capacitors, where the space or gap between the housing and the terminals can form the dielectric separating the conductors of the capacitor. In some embodiments, a portion of dome 320 (e.g., a tip of the dome) can be used instead of or in addition to button 310 as a conductor for a capacitor. In some embodiments, one or more of housing 311 and terminals 312A and 312B can be electrically grounded.

To detect changes in capacitance, terminals 312A and 312B can be coupled to controller 330. When button 310 is depressed, dome 320 can deflect such that the distance between button 310 and terminals 312A and 312B can decrease. The controller can then measure a change in capacitance within a capacitor formed from terminals 312A and 312B as conductors. Alternatively, the electronic device can measure a change in capacitance in each of a first capacitor formed from button 310 (or a user's finger) and terminal 312A, and a second capacitor formed from button 310 (or a user's finger) and terminal 312B. The controller can then use the change in capacitance in one or both of the capacitors to detect a particular input provided using button 310.

A user can apply a force F on button 310 to actuate the switch. The user can apply force F using any suitable action including, for example, by pressing, tapping, holding, touching, or squeezing button 310 or housing 311. Controller 330 can detect force F by measuring a change in capacitance corresponding to a change in spacing between the housing 311 and terminals 312A and 312B. In particular, as housing 311 is displaced, the initial distance d1 between each of the terminals 312A and 312B may decrease to d2A and d2B, respectively. The reduced distance, in some cases combined with a capacitance inherent to a user's finger, can change the amount of capacitance detected in each capacitor of assembly 300. In some embodiments, controller 330 can determine the location at which the user is applying force F by determining which of the terminals 312A and 312B experience the largest change in capacitance (corresponding to the largest movement in the housing 311 and deflection in dome 320, or corresponding to the closest proximity of the user's finger to the terminals).

Controller 330 can be operative to detect any suitable difference in capacitance or capacitance value between different conductors. In particular, the electronic device can define one or more thresholds corresponding to detected changes in capacitance or capacitance values. For example, the controller can define a first threshold corresponding to a first change in capacitance when a user's finger is placed over a dome (e.g., in contact with a button), and a second threshold corresponding to a second change in capacitance when the user's finger causes the dome to deflect (e.g., the user's finger comes closer to the circuit board). The electronic device can perform different operations when a detected capacitance value or a detected change in capacitance value reaches each of the capacitance thresholds.

Figure 4A:
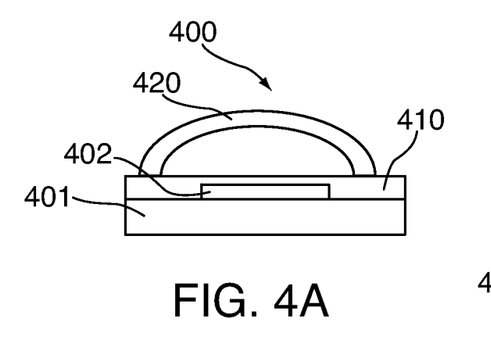
FIGS. 4A and 4B are cross-sectional views of illustrative capacitive capacitor terminals incorporated in an electronic device component in accordance with one embodiment of the invention.
Figure 4B:
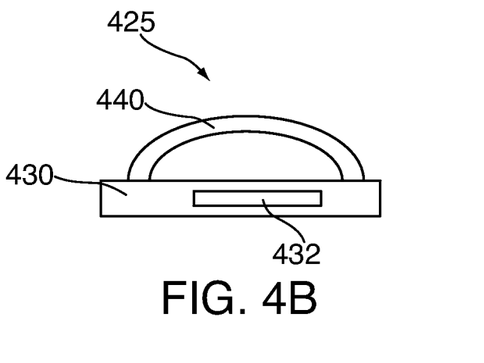

Because the terminals forming conductors of a capacitor do not need to come into direct electrical contact with the dome, the terminals can be protected from debris or other contaminants originating from outside of the device without affecting the functionality of the dome switch. FIGS. 4A and 4B are cross-sectional views of illustrative terminals incorporated in an electronic device component in accordance with one embodiment of the invention. Element 400, shown in FIG. 4A, can include circuit board 401 for supporting one or more electronic device components and dome 420 placed over the circuit board. For example, one or more components can be coupled to circuit board 401 using a soldering or SMT process. To form a conductor of a capacitor, circuit board 401 can include conductive terminal 402 placed on a surface of the circuit board. For example, a conductive trace (e.g., copper) can be deposited on circuit board 401. As another example, a conductive coating can be applied to a region of circuit board 401 corresponding to terminal 402. As still another example, a conductive component can be connected to circuit board 401 to form terminal 402 (e.g., using soldering or SMT). Terminal 402 can be electrically connected to one or more components of the electronic device including, for example, a controller or other circuitry for detecting capacitance values or changes in capacitance between two conductors.

To protect terminal 402 from debris, protective layer 410 can be placed over terminal 402. In some embodiments, protective layer 410 can in addition be placed over some or all of a top surface of circuit board 401, for example to ensure that side walls of terminal 402 are covered and protected. Protective layer 410 can be constructed from any suitable material. In some embodiments, the protective layer can be constructed from a plastic (e.g., paralyne), polymer, composite material or combinations of these. In some cases, it may be desirable for protective layer 410 to be constructed from a dielectric material so that protective layer 410 does not interfere with the detection of capacitance levels corresponding to terminal 402.

In some embodiments, the material used for protective layer 410 can be selected based on mechanical properties of the material to ensure that terminal 402 can be adequately protected from interference or damage due to foreign contaminants or particles. For example, the material selected can have a stiffness, resistance to abrasions, friction coefficient, or other mechanical characteristics suitable to protect terminal 402. The particular material properties can be selected to protect terminal 402 from any suitable type of contaminants. For example, the material can be selected based on a type of contaminant or properties of contaminants likely to reach the terminal in light of the position of the dome switch assembly within the electronic device (e.g., select a material to protect from water or sweat damage when the dome switch is in an area of the device that comes into contact with the user's skin).

Protective layer 410 can be applied to terminal 402 using any suitable approach. For example, one or more of a powder coating process, vapor deposition, thin film deposition, and liquid dipping can be used. In some embodiments, a material can instead or in addition be coupled to the circuit board and terminal using a stand-alone adhesive, or an adhesive integrated with a film (e.g., placing a piece of tape or an adhesive and a film over the circuit board and conductor). In some embodiments, protective layer 410 can be applied such that terminal 402 is not exposed to the environment of the dome switch, and in particular does not come into contact with air flowing from outside of the electronic device (e.g., air containing contaminants). In particular, no surface of the terminal may be exposed.

Element 425, shown in FIG. 4B, can include circuit board 430 and terminal 432, and dome 440 placed over the circuit board, which can include some or all of the features of the corresponding components of element 400 (FIG. 4A). In contrast with element 400, terminal 432 can be constructed such that it is within the volume enclosed by circuit board 420. In one implementation, circuit board 430 can be constructed by overlaying several layers of material. To construct terminal 432 within the circuit board, the material corresponding to terminal 432 can be inserted in one of the several layers as it is created, and subsequently covered by an additional layer of the circuit board. Alternatively, a pocket can be constructed within the volume of circuit board 430 (e.g., core out a pocket through a side wall or exterior surface of the circuit board) into which material used for the terminal can be provided. For example, a conductive material can be inserted in a pocket or receptacle formed within the circuit board volume. Once the material forming the terminal is positioned in the pocket, the pocket can be closed, for example using a material used for the circuit board (e.g., a dielectric material to electrically insulate the terminal). The resulting terminal can be isolated from the device environment, and in particular isolated from air originating from outside of the electronic device (e.g., air containing contaminants). In particular, no external surface of the terminal may be exposed.

The terminals used for different switch assemblies described herein can have any suitable size and shape. In some embodiments, the shape selected for a particular terminal can be selected based on characteristics of a controller used to detect changes in capacitance. The particular size and shape of each terminal in a switch assembly can be the same or vary. For example, a terminal that is closer to a button's center can be smaller or larger than a terminal that is farther away. The terminal shapes can include, for example, a triangular, square, rectangular, polygonal, circular, elliptical, curved, or arbitrary shape (e.g., a series of interlocking fingers, or cross-shaped pattern) when projected in one or more planes (e.g., in a plane of the circuit board). In some embodiments, the size of a particular terminal can be selected to match the size of the dome (e.g., the terminal can include a disc sized to substantially correspond to the periphery of the dome).

Figure 5:
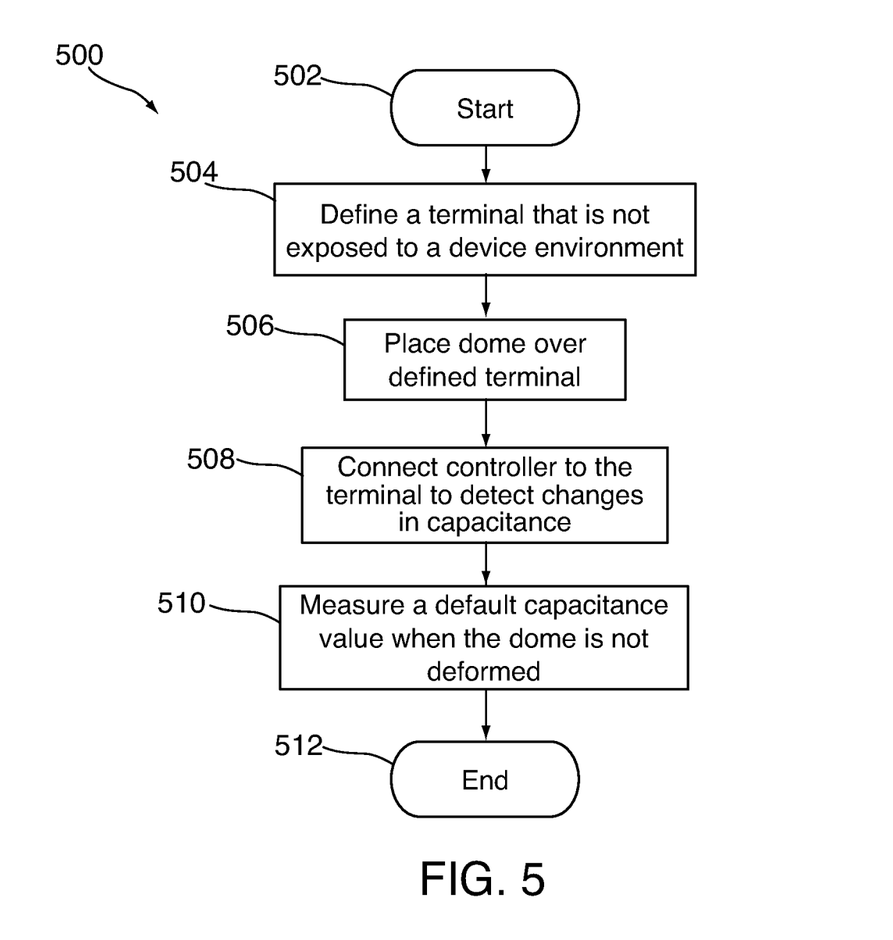
FIG. 5 is a flowchart of an illustrative process for constructing a capacitive dome switch for which a conductor is not exposed in accordance with one embodiment of the invention.

FIG. 5 is a flowchart of an illustrative process for constructing a capacitive dome switch for which a conductor is not exposed in accordance with one embodiment of the invention. Process 500 can begin at step 502. At step 504, a terminal that is not exposed to a device environment can be defined. For example, a terminal can be constructed within a volume of an electronic device component. As another example, terminal can be constructed on an exterior surface of a device component, and can be covered by protective layer. At step 506, a dome can be placed over the defined terminal. For example, a dome providing a tactile response when a user actuates a button to provide an input to the electronic device can be aligned with the defined terminal. In some embodiments, a spring mechanism can be used instead of or in addition to the dome. At step 508, a controller can be connected to the terminal to detect changes in capacitance. For example, a controller can be connected to the terminal such that the controller can measure capacitance values or changes in capacitance of a capacitor for which the terminal constitutes a conductor. The second conductor of the capacitor can include, for example, a button, a user's finger placed over the dome, a second terminal that is not exposed within the device (e.g., a second terminal in a volume of a same circuit board), or combinations of these. At step 510, the controller can measure a default or baseline capacitance value for the terminal when the dome is not deformed. For example, the controller can measure a default capacitance value that corresponds to the absence of a user input. The default value can then be compared to other capacitance values detected when a user applies a force to the dome switch. In some embodiments, step 510 can be skipped, and instead performed during operation of the device (e.g., repeatedly performed). Process 500 can then end at step 512.

In some embodiments, a different mechanism can be used instead of a capacitance sensor to detect a force applied to a dome switch. For example, an ultrasonic detector can be used as a proximity sensor to detect the distance between the button and a circuit board (e.g., by emitting and detecting ultrasounds or other sound waves). As another example, a microphone can be used to detect the sound of the dome inverting. In particular, a controller or processor can be calibrated to identify a particular audible frequency associated with the inversion of the dome. In some embodiments, an optical component can be used to detect a button actuation. For example, an optical component can detect a shadow associated with a dome or button, and monitor for a change in the shadow. In particular, an optical component can monitor for a change in shadow corresponding to a button press. The optical component can be placed in any suitable location relative to the dome, including for example under the dome (e.g., looking up into the dome), or to the side of the dome. In some embodiments, a pressure pad or pressure component can be used to detect inputs. For example, a button can be pressed and provide a force to a pressure pad placed underneath the button. The button can include an extension providing a contact between the button and the pressure pad. In some embodiments, the extension can include a spring operative to deflect and allow the button to travel. The spring constant and the pressure pad can be tuned to define the force and displacement required from the button to provide an input to the device.

The above described embodiments of the present invention are presented for purposes of illustration and not of limitation, and the present invention is limited only by the claims which follow.

What is claimed is:

1. An assembly comprising:
a dome switch comprising:
a substrate;
a dome coupled to the substrate;
a first conductor coupled to the substrate and at least partially positioned under the dome; and
a second conductor coupled to the substrate and at least partially positioned under the dome; and
a controller operatively coupled to the first conductor and the second conductor of the dome switch, the controller configured to:
detect a change in a first capacitance of the first conductor when a force is applied to the dome;
detect a change in a second capacitance of the second conductor when the force is applied to the dome; and
estimate a measurable force applied to the dome based on the detected change in the first capacitance and the detected change in the second capacitance; wherein
at least one of the first conductor or the second conductor is partially positioned outside the dome.

2. The assembly of claim 1, wherein the estimated measurable force further comprises one of:
a touch force; and
a deforming force.

3. The assembly of claim 1, wherein a location of the dome where the force is applied is determined by comparing the change in the first capacitance with the change in the second capacitance.

4. The assembly of claim 3, wherein the location is closer to the first conductor when the change in the first capacitance exceeds the change in the second capacitance.

5. The assembly of claim 1, wherein contact between the dome and at least one object causes at least a change in a third capacitance of the first conductor and at least a change in a fourth capacitance of the second conductor.

6. The assembly of claim 1, wherein the dome is deformable to a first deformed position and a second deformed position.

7. The assembly of claim 6, wherein deformation of the dome to the first deformed position causes the change in the first capacitance and the second change in the second capacitance.

8. The assembly of claim 7, wherein deformation of the dome to the second deformed position causes at least a change in a third capacitance of the first conductor and at least a change in a fourth capacitance of the second conductor.

9. The assembly of claim 8, wherein the change in the first capacitance and the change in the second capacitance are associated with a first threshold and the change in the third capacitance and the change in the fourth capacitance are associated with a second threshold.

10. The assembly of claim 9, wherein the first threshold is interpreted as at least one first input and the second threshold is interpreted as at least one second input.

11. An assembly comprising:
a dome switch comprising:
a substrate;
a dome coupled to the substrate, the dome deformable to at least one of a first position and a second position; and
a conductor coupled to the substrate and at least partially positioned under the dome and partially positioned outside the dome; and
a controller operatively coupled to the conductor of the dome switch, the controller configured to:
detect a first change in capacitance of the conductor when a first force is applied to deform the dome to the first position;
detect a second change in capacitance of the conductor when a second force is applied to deform the dome to the second position; and
estimate a measurable force applied to the dome based on the detected first change in capacitance and the detected second change in capacitance; wherein
the estimated measurable force comprise one of:
a touch force; and
a deforming force.

12. The assembly of claim 11, wherein the first change in capacitance is associated with a first threshold and the second change in capacitance is associated with a second threshold.

13. The assembly of claim 12, wherein the first threshold is interpreted as at least one first input and the second threshold is interpreted as at least one second input.

14. The assembly of claim 13, wherein contact between the dome and at least one object causes at least a third change in capacitance of the conductor.

15. The assembly of claim 14, wherein the third change in capacitance is associated with a third threshold.

16. The assembly of claim 15, wherein the third threshold is interpreted as at least one third input.

17. The assembly of claim 11, further comprising an additional conductor positioned entirely under the dome, the additional conductor integrally formed within the substrate.

18. The assembly of claim 11, wherein the dome has variable resistance to deformation.

19. An electronic device, comprising:
   at least one housing;
   at least one dome switch, coupled to the at least one housing, comprising:
      a substrate;
      a dome coupled to the substrate, the dome deformable to at least one of a first position and a second position; and
      a conductor coupled to the substrate and at least partially positioned under the dome and partially positioned outside the dome; and
   a controller operatively coupled to the conductor, the controller configured to:
      detect a first change in capacitance of the conductor when a first force is applied to deform the dome to the first position;
      detect a second change in capacitance of the conductor when a second force is applied to deform the dome to the second position; and
      estimate a measurable force applied to the dome based on the detected first change in capacitance and the detected second change in capacitance; wherein the estimated measurable force comprise one of:
         a touch force; and
         a deforming force.

20. An electronic device, comprising:
   at least one housing;
   at least one dome switch, coupled to the at least one housing, comprising:
      a substrate;
      a dome coupled directly to the substrate;
      a first conductor integrally formed within the substrate and at least partially positioned under the dome; and
      a second conductor integrally formed within the substrate and at least partially positioned under the dome; wherein
   deformation of the dome causes at least a change in a first capacitance of the first conductor and a change in a second capacitance of the second conductor and at least one of the first conductor or the second conductor is partially positioned outside the dome.

21. The assembly of claim 1, wherein the controller is further operative to generate an input signal based on the estimated measurable force.

22. The assembly of claim 11, wherein the controller is further operative to generate an input signal based on the estimated measurable force.

23. The electronic device of claim 19, wherein the controller is further operative to generate an input signal based on the estimated measurable force.

* * * * *